United States Patent
Arnold et al.

(10) Patent No.: US 9,287,359 B1
(45) Date of Patent: Mar. 15, 2016

(54) ORIENTED BOTTOM-UP GROWTH OF ARMCHAIR GRAPHENE NANORIBBONS ON GERMANIUM

(71) Applicant: Wisconsin Alumni Research Foundation, Madison, WI (US)

(72) Inventors: Michael Scott Arnold, Middleton, WI (US); Robert Michael Jacobberger, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 14/486,149

(22) Filed: Sep. 15, 2014

(51) Int. Cl.
| | | |
|---|---|---|
| H01L 27/108 | (2006.01) |
| H01L 29/06 | (2006.01) |
| H01L 31/00 | (2006.01) |
| H01L 29/08 | (2006.01) |
| H01L 29/04 | (2006.01) |
| H01L 29/16 | (2006.01) |
| H01L 21/02 | (2006.01) |

(52) U.S. Cl.
CPC ........ H01L 29/0673 (2013.01); H01L 21/0262 (2013.01); H01L 21/02381 (2013.01); H01L 21/02433 (2013.01); H01L 21/02527 (2013.01); H01L 21/02603 (2013.01); H01L 21/02609 (2013.01); H01L 29/045 (2013.01); H01L 29/1606 (2013.01)

(58) Field of Classification Search
CPC ............ H01L 21/283; H01L 21/02491; H01L 29/1606; H01L 21/0237; H01L 21/02527; H01L 33/26; H01L 29/1004; H01L 31/02161
USPC ................... 257/296, 9, 29, E29.082, 15, 25; 438/694, 478, 610, 151, 162; 428/195.1; 977/843
See application file for complete search history.

(56) References Cited

U.S. PATENT DOCUMENTS

| | | | |
|---|---|---|---|
| 2010/0200840 A1* | 8/2010 | Anderson et al. ............... 257/29 |
| 2010/0255219 A1* | 10/2010 | Wenxu et al. ................ 427/596 |
| 2011/0114919 A1* | 5/2011 | Jenkins et al. .................. 257/29 |
| 2011/0244662 A1 | 10/2011 | Lee et al. |
| 2012/0003438 A1 | 1/2012 | Appleton et al. |
| 2012/0068157 A1 | 3/2012 | Kub |
| 2012/0085991 A1* | 4/2012 | Cohen et al. .................... 257/28 |
| 2012/0141799 A1 | 6/2012 | Kub et al. |
| 2012/0181507 A1 | 7/2012 | Dimitrakopoulos et al. |

(Continued)

FOREIGN PATENT DOCUMENTS

EP 2540662 1/2013

OTHER PUBLICATIONS

Lippert et al., Graphene Grown on Ge(001) from Atomic Source, Obtained online from Cornell University Library, published prior to Mar. 21, 2014.

(Continued)

Primary Examiner — Long K Tran
Assistant Examiner — Dzung Tran
(74) Attorney, Agent, or Firm — Bell & Manning, LLC

(57) ABSTRACT

Graphene nanoribbon arrays, methods of growing graphene nanoribbon arrays and electronic and photonic devices incorporating the graphene nanoribbon arrays are provided. The graphene nanoribbons in the arrays are formed using a scalable, bottom-up, chemical vapor deposition (CVD) technique in which the (001) facet of the germanium is used to orient the graphene nanoribbon crystals along the [110] directions of the germanium.

8 Claims, 12 Drawing Sheets

(56) References Cited

U.S. PATENT DOCUMENTS

| | | | |
|---|---|---|---|
| 2012/0261644 A1* | 10/2012 | Dimitrakopoulos | ............ 257/29 |
| 2013/0027778 A1 | 1/2013 | Currie et al. | |
| 2013/0099195 A1 | 4/2013 | Seacrist et al. | |
| 2013/0099205 A1* | 4/2013 | Liu et al. | ............ 257/28 |
| 2013/0108839 A1 | 5/2013 | Arnold et al. | |
| 2013/0160701 A1 | 6/2013 | Arnold et al. | |
| 2014/0264281 A1 | 9/2014 | Niyogi et al. | |
| 2015/0037048 A1 | 2/2015 | Na et al. | |

OTHER PUBLICATIONS

T. Wogan, Growing great graphene on germanium, Chemistry World, http://www.rsc.org/chemistryworld/2014/04/growing-great-graphene-germanium-defect-free-electronics, Apr. 3, 2014.

Lee et al., Wafer-Scale Growth of Single-Crystal Monolayer Graphene on Reusable Hydrogen-Terminated Germanium, Science, vol. 344, Apr. 18, 2014, pp. 286-289.

Wang et al., Direct Growth of Graphene Film on Germanium Substrate, Scientific Reports, vol. 3, No. 2465, Aug. 19, 2013.

Prabhakaran et al., Distinctly different thermal decomposition pathways of ultrathin oxide layer on Ge and Si surfaces, Applied Physics Letters, vol. 76, No. 16, Apr. 17, 2000, pp. 2244-2246.

Nazarenkov et al., Mechanism of photo-stimulated processes in GeOx films, Thin Solid Films, vol. 254, 1995, pp. 164-168.

A. Toriumi, Recent Progress of Germanium MOSFETs, 2012 IEEE International Meeting for Future of Electron Devices, Kansai (IMFEDK), Osaka, May 9, 2012, pp. 1-2.

Wang et al., Germanium nanowire field-effect transistors with SiO2 and high-k HfO$_2$ gate dielectrics, Applied Physics Letters, vol. 83, No. 12, Sep. 22, 2003, pp. 2432-2434.

K. Saraswat, Novel Electronic and Optoelectronic Devices in Germanium Integrated on Silicon, ECS Transactions, vol. 33, No. 6, 2010, pp. 101-108.

Saraswat et al., High performance germanium MOSFETs, Materials Science and Engineering B, vol. 135, 2006, pp. 242-249.

Toriumi et al., Material Potential and Scalability Challenges of Germanium CMOS, 2011 IEEE International Electron Devices Meeting (IEDM), Washington, DC , Dec. 5, 2011, pp. 28.4.1-28.4.4.

Y. Kamata, High-k/Ge MOSFETs for future nanoelectronics, materials today, vol. 11, No. 1-2, Jan. 2008, pp. 30-38.

Brunco et al., Germanium MOSFET Devices: Advances in Materials Understanding, Process Development, and Electrical Performance, Journal of the Electrochemical Society, vol. 155, No. 7, May 23, 2008, pp. H552-H561.

Chui et al., a Sub-400° C. Germanium MOSFET Technology with High-K Dielectric and Metal Gate, International Electron Devices Meeting, 2002. IEDM '02, San Francisco, CA, Dec. 8, 2002, pp. 437-440.

Klekachev et al., Graphene Transistors and Photodetectors, The Electrochemical Society Interface, vol. 22, No. 1, Spring 2013, pp. 63-68.

Bodlaki et al., Ambient stability of chemically passivated germanium interfaces, Surface Science, vol. 543, 2003, pp. 63-74.

Boztug et al., Strained-Germanium Nanostructures for Infrared Photonics, ACS Nano, vol. 8, No. 4, Mar. 5, 2014, pp. 3136-3151.

Cooper et al., Experimental Review of Graphene, International Scholarly Research Network Condensed Matter Physics, vol. 2012, article ID 501686, 2012, pp. 1-56.

Online Disclosure for P130002US01, Available online prior to Mar. 21, 2014.

Li et al., Synthesis, Characterization, and Properties of Large-Area Graphene Films, ECS Transactions, vol. 19, No. 5, 2009, pp. 41-52.

Biro et al., Nanopatterning of graphene with crystallographic orientation control, Carbon, vol. 48, Apr. 14, 2010, pp. 2677-2689.

Nemes-Incze et al., Graphene nanoribbons with zigzag and armchair edges prepared by scanning tunneling microscope lithography on gold substrates microscope lithography on gold substrates, Applied Surface Science, vol. 291, Nov. 13, 2013, pp. 48-52.

Wang et al., Etching and Narrowing of Graphene from the Edges, Nature Chemistry, vol. 2, Jun. 27, 2010, pp. 661-665.

Non-Final Office Action for U.S. Appl. No. 14/222,163, mailed on Jun. 29, 2015, 23 pp.

\* cited by examiner

Table 1. Graphene Growth Conditions for Nanoribbon Formation

| T (°C) | t (h) | Ar (sccm) | H₂ (sccm) | CH₄ (sccm) | # | w (nm) | σ (nm) | l (nm) | σ (nm) | a.r. | σ (nm) | $R_w$ (nm/h) | $R_l$ (nm/h) |
|---|---|---|---|---|---|---|---|---|---|---|---|---|---|
| 910 | 1 | 200 | 100 | 2.8 | 178 | 9.79 | 4.02 | 182 | 42 | 19.0 | 4.3 | 4.90 | 91.0 |
| 910 | 2 | 200 | 100 | 2.8 | 482 | 18.5 | 8.3 | 341 | 98 | 20.2 | 5.5 | 4.63 | 85.3 |
| 910 | 3 | 200 | 100 | 2.8 | 260 | 30.9 | 14.9 | 501 | 158 | 18.0 | 5.0 | 5.15 | 83.5 |
| 910 | 6 | 200 | 100 | 2.8 | 290 | 74.0 | 36.4 | 986 | 364 | 14.5 | 3.6 | 6.17 | 82.2 |
| 910 | 9 | 200 | 100 | 2.8 | 279 | 151 | 68 | 1617 | 512 | 12.0 | 3.6 | 8.39 | 89.8 |
| 910 | 13.75 | 200 | 100 | 2.8 | 303 | 305 | 109 | 2747 | 710 | 9.6 | 2.2 | 11.1 | 99.9 |
| 910 | 18.25 | 200 | 100 | 2.0 | 148 | 51.9 | 20.9 | 1454 | 295 | 31.2 | 9.8 | 1.42 | 39.8 |
| 910 | 6 | 200 | 100 | 2.5 | 195 | 50.7 | 20.3 | 849 | 237 | 18.3 | 5.1 | 4.23 | 70.8 |
| 910 | 2.5 | 200 | 100 | 3.0 | 199 | 34.2 | 16.4 | 490 | 177 | 15.6 | 3.8 | 6.84 | 98.0 |
| 910 | 1.5 | 200 | 100 | 3.5 | 254 | 32.4 | 19.5 | 408 | 168 | 14.8 | 4.9 | 10.8 | 136 |
| 910 | 0.5 | 200 | 100 | 4.0 | 286 | 15.2 | 5.6 | 200 | 66 | 13.6 | 3.2 | 15.2 | 200 |
| 910 | 0.75 | 200 | 100 | 4.4 | 246 | 27.6 | 11.5 | 346 | 109 | 13.3 | 2.8 | 18.4 | 231 |
| 910 | 0.5 | 200 | 100 | 5.0 | 297 | 22.9 | 11.8 | 285 | 120 | 13.3 | 3.1 | 22.9 | 285 |
| 910 | 8.5 | 210 | 90 | 2.0 | 404 | 72.5 | 33.9 | 1126 | 329 | 17.9 | 6.8 | 4.26 | 66.2 |
| 910 | 4 | 215 | 85 | 2.0 | 267 | 40.4 | 19.6 | 680 | 214 | 19.3 | 6.3 | 5.05 | 85.0 |
| 910 | 3 | 220 | 80 | 2.0 | 276 | 38.9 | 20.4 | 590 | 195 | 17.7 | 6.3 | 6.48 | 98.3 |
| 910 | 2 | 225 | 75 | 2.0 | 309 | 39.2 | 18.3 | 571 | 177 | 16.3 | 5.1 | 9.80 | 143 |
| 910 | 1 | 230 | 70 | 2.0 | 289 | 24.2 | 12.4 | 336 | 111 | 15.9 | 5.6 | 12.1 | 168 |
| 910 | 0.75 | 235 | 65 | 2.0 | 334 | 26.6 | 15.4 | 308 | 126 | 13.2 | 4.4 | 17.7 | 205 |
| 930 | 1 | 200 | 100 | 2.8 | 377 | 37.1 | 18.6 | 589 | 181 | 18.4 | 6.7 | 18.6 | 295 |
| 925 | 2 | 200 | 100 | 2.8 | 345 | 76.7 | 42.9 | 854 | 343 | 13.7 | 6.5 | 19.2 | 214 |
| 917 | 2.5 | 200 | 100 | 2.8 | 259 | 28.2 | 14.6 | 564 | 187 | 23.0 | 8.1 | 5.64 | 113 |
| 903 | 7.25 | 200 | 100 | 2.8 | 306 | 48.3 | 21.7 | 886 | 235 | 20.8 | 6.8 | 3.33 | 61.1 |
| 895 | 10 | 200 | 100 | 2.8 | 255 | 33.8 | 16.9 | 665 | 239 | 22.0 | 7.2 | 1.69 | 33.3 |

FIG. 2

Table 2. Additional Graphene Growth Conditions for Nanoribbon Crystal Structure Growth

| T (°C) | t (h) | Ar (sccm) | H₂ (sccm) | CH₄ (sccm) |
|---|---|---|---|---|
| 860 | 6 | 200 | 50 | 1.6 |
| 895 | 23.5 | 200 | 100 | 2.7 |
| 910 | 1.7 | 200 | 50 | 1.0 |
| 910 | 5 | 200 | 50 | 1.0 |
| 910 | 10.5 | 200 | 50 | 1.0 |
| 925 | 1 | 200 | 50 | 1.0 |
| 935 | 5 | 200 | 50 | 1.0 |
| 910 | 1 | 200 | 40 | 1.0 |
| 910 | 3.3 | 200 | 60 | 1.0 |
| 910 | 14.5 | 200 | 60 | 1.0 |
| 910 | 8 | 200 | 70 | 1.0 |
| 910 | 4 | 200 | 70 | 1.8 |
| 910 | 5 | 200 | 80 | 2.2 |
| 910 | 11.75 | 200 | 80 | 2.2 |
| 910 | 4 | 200 | 100 | 3.2 |
| 860 | 6 | 200 | 50 | 1.6 |

ORIENTED BOTTOM-UP GROWTH OF ARMCHAIR GRAPHENE NANORIBBONS ON GERMANIUM

REFERENCE TO GOVERNMENT RIGHTS

This invention was made with government support under DE-SC0006414 awarded by the US Department of Energy. The government has certain rights in the invention.

BACKGROUND

Graphene is a two-dimensional carbon allotrope, the electronic, optical, and magnetic properties of which can be tuned by engineering two-dimensional graphene sheets into one-dimensional structures with confined width, known as graphene nanoribbons. The properties of graphene nanoribbons are highly dependent on their width and edge structure.

It has been proposed that graphene nanoribbons will outperform conventional materials and lead to next-generation technologies. Graphene nanoribbons have already shown tremendous promise for providing enhanced performance in nanoelectronics, spintronics, optoelectronics, plasmonic waveguiding, photodetection, solar energy conversion, molecular sensing, and catalysis. However, the full potential of graphene nanoribbons in such applications has not been realized.

A major challenge facing graphene nanoribbon-based devices is that scalable approaches to create high-quality graphene nanoribbons with atomically-smooth edges are lacking. Conventional, top-down techniques in which graphene nanoribbons are etched from continuous graphene sheets result in structures with rough, disordered edges that are riddled with defects, which significantly degrade graphene's exceptional properties. This blunt top-down etching can be avoided by synthesizing nanoribbons from the bottom-up. For instance, organic synthesis can yield ribbons with smooth edges, defined widths, and complex architectures. However, organic synthesis forms short nanoribbons (typically ~20 nm in length) and is not adapted to technologically relevant substrates, such as insulators or semiconductors, limiting its potential for commercial development.

SUMMARY

Graphene nanoribbon arrays, methods of growing graphene nanoribbon arrays and electronic and photonic devices incorporating the graphene nanoribbon arrays are provided.

One embodiment of a graphene nanoribbon array comprises: a germanium substrate having a (001) facet; and a plurality of graphene nanoribbons on the (001) facet of the germanium substrate. The graphene nanoribbons have aspect ratios of at least 5 and the average aspect ratio of the graphene nanoribbons in the plurality of nanoribbons is at least 10 and, in some embodiments, at least 20. The graphene nanoribbons comprise two edges that run substantially parallel along the length of the nanoribbon and they have the armchair crystallographic direction of graphene running parallel to the nanoribbon edges. That is—they have carbon-carbon bonds running parallel to the long nanoribbon axis. The graphene nanoribbons are characterized in that the long ribbon axis is oriented along the [110] directions of the germanium surface.

One embodiment of a method of growing graphene nanoribbons comprises the steps of: growing graphene on the (001) facet of a germanium substrate via chemical vapor deposition from a mixture of methane gas and hydrogen gas, wherein the partial pressures of methane and hydrogen are selected to result in the growth of a plurality of graphene nanoribbons having their long axis oriented along the [110] directions of the germanium substrate and the armchair crystallographic direction of graphene running parallel to the long nanoribbon axis, wherein the graphene nanoribbons are grown with an average aspect ratio of at least 10 and, in some embodiments, at least 20.

Some embodiments of the graphene nanoribbon arrays include graphene nanoribbons having edges with an rms roughness of 1 nm or lower over edge lengths of at least 40 nm.

Once grown on the germanium substrate, the graphene nanoribbons can be released from that substrate and transferred to an arbitrary second substrate to provide a graphene nanoribbon array.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 2. Table 1. Growth conditions used to grow graphene nanoribbons, including the growth temperature, (T), growth time (t), Ar flux (Ar), $H_2$ flux ($H_2$), $CH_4$ flux ($CH_4$), number of nanoribbons analyzed (n), average nanoribbon width (w) and standard deviation ($\sigma_w$), average nanoribbon length (l) and standard deviation (m), average nanoribbon aspect ratio and standard deviation ($\sigma_{ar}$), and growth rate of nanoribbon width ($R_w$) and length ($R_l$).

FIG. 3. Table 2. Other growth conditions that yielded graphene nanoribbons, including the growth temperature, (T), growth time (t), Ar flux (Ar), $H_2$ flux ($H_2$), and $CH_4$ flux ($CH_4$).

Growth conditions: $CH_4$ mole fraction is 0.0066, total pressure is 760 Torr, temperature is 910° C.

Figure 10:
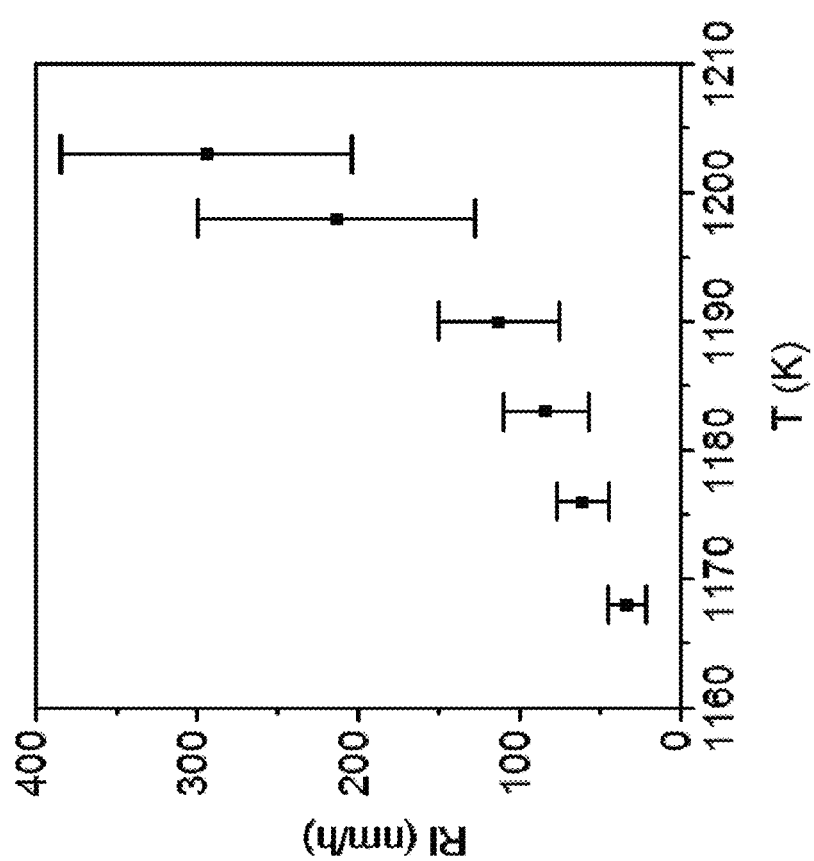

FIG. 10. Nanoribbon length ($R_l$) plotted against temperature (T). The Ar flux is 200 sccm, $H_2$ flux is 100 sccm, $CH_4$ flux is 2.8 sccm, and total pressure is 760 Torn Error bars indicate standard deviation.

Figure 11:
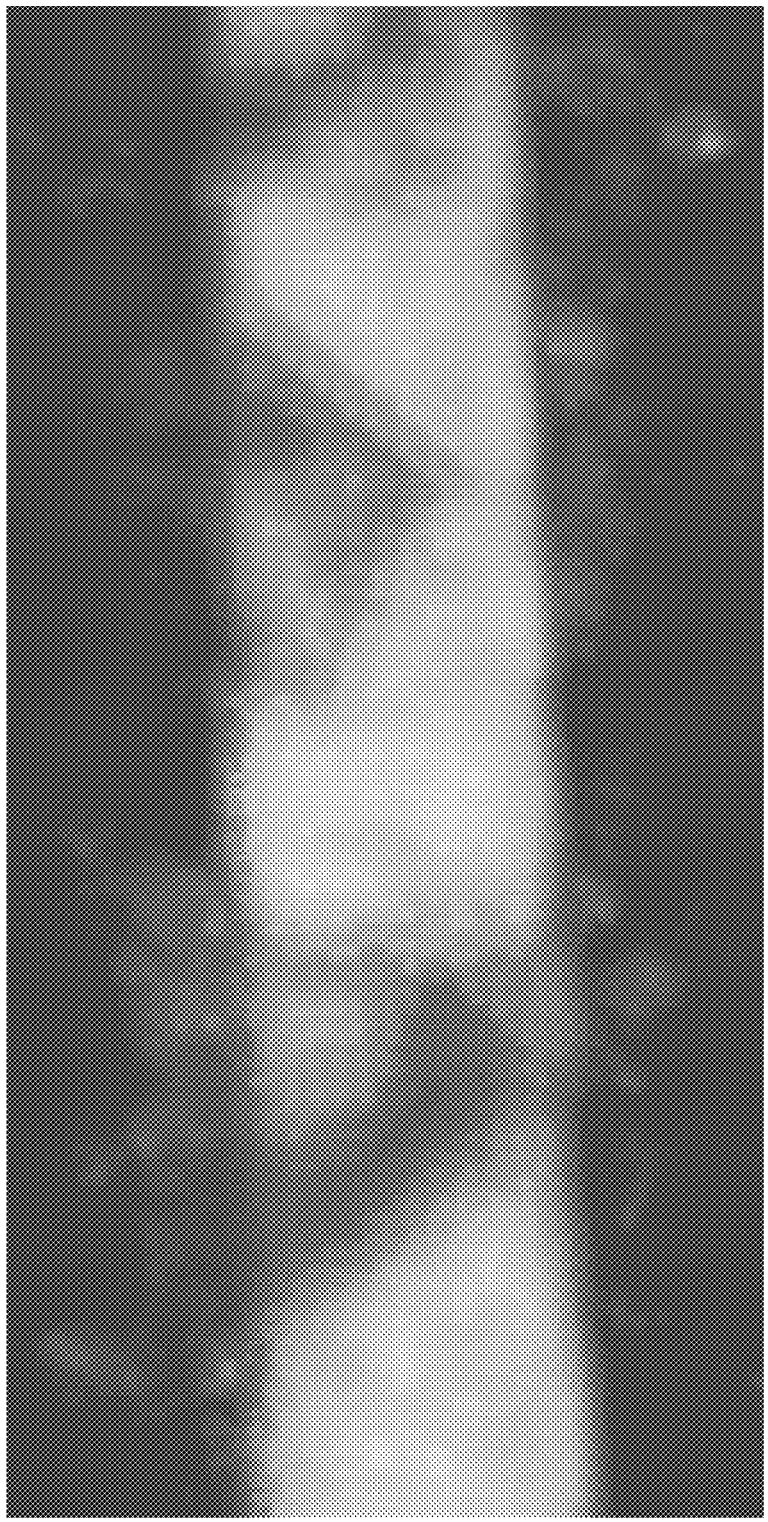

FIG. 11. Scanning tunneling microscope (STM) image of a nanoribbon having atomically smooth edge segments. The nanoribbon was grown at 910° C. with Ar, $H_2$, and $CH_4$ fluxes of 200, 100, and 2.8 sccm, respectively, for 1.5 hours at 760 Torr. The image is 20 nm by 40 nm.

Figure 12:
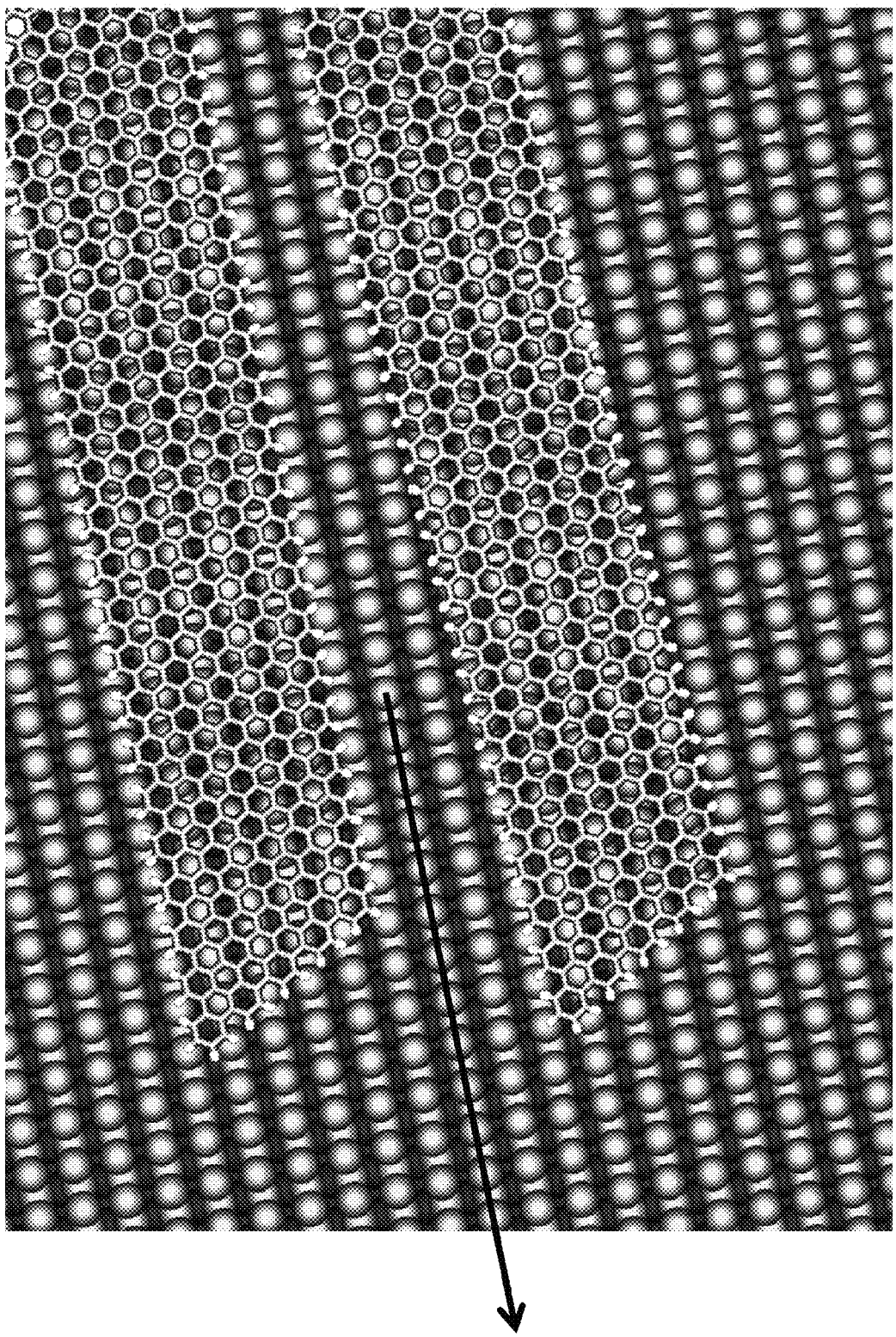

FIG. 12. Schematic illustration of a graphene nanoribbon with armchair edges perfectly aligned along the Ge[110] direction (upper nanoribbon) and a graphene nanoribbon with armchair edges aligned within ± about 3° (2.9°) of the Ge[110] direction.

DETAILED DESCRIPTION

Graphene nanoribbon arrays, methods of growing graphene nanoribbon arrays and electronic and photonic devices incorporating the graphene nanoribbon arrays are provided. The graphene nanoribbons in the arrays are narrow, elongated strips (or "ribbons") of monolayer graphene having widths and crystallographic edge structures that provide the ribbons with electronic properties, such as electronic bandgaps, that are absent in continuous two-dimensional films of graphene. The graphene nanoribbons in the arrays are formed using a scalable, bottom-up, chemical vapor deposition (CVD) technique to grow oriented graphene nanoribbons with atomically-smooth edges on the (001) facet of germanium substrates. CVD is an inexpensive scalable technique, offering high throughput and compatibility with planar processing. The graphene nanoribbons are grown directly on a semiconductor platform, germanium, which can be purchased as a single-crystal wafer or can be epitaxially grown on silicon wafers and gallium arsenide wafers. These materials are available in large formats and are prevalent in the semiconductor industry. During the CVD growth process, the (001) facet of the germanium is used to orient the long edges of the graphene nanoribbons as well as the armchair direction of the graphene lattice within the ribbons along the [110] directions of the germanium. In addition, the graphene growth rate is highly anisotropic, resulting in faceted graphene nanoribbons with high aspect ratios. The nanoribbons are grown with exclusively or almost exclusively armchair configurations along their edges. Although there may be a minute portion of zigzag segments near defects or kinks at the nanoribbon edges.

The armchair crystallographic direction of graphene, as well as the long nanoribbon edges, may not run perfectly parallel to the Ge[110] directions. Therefore, for the purposes of this disclosure the graphene nanoribbons are considered to be "oriented along a direction of the germanium" if their armchair direction and long nanoribbon axis are aligned within ±4° of the [110] direction of the germanium. This is illustrated schematically in FIG. 11. In that figure, the lighter grey circles represent the top two layers of germanium in the substrate, while the darker grey circles, which are only partially visible under the top two layers, represent germanium atoms in lower layers of the substrate. The arrow represents the Ge[110] direction. The upper graphene nanoribbon is perfectly aligned along the Ge[110] direction. In the lower graphene nanoribbon, the armchair crystallographic direction of graphene and the long axis of the ribbons deviate by about 3° from perfect alignment.

Because the graphene nanoribbons are grown, rather than patterned lithographically from graphene sheets, they are formed with atomically smooth edges. The degree of edge smoothness can be characterized by the average root mean square (rms) roughness of the edges of the nanoribbons in the array. The rms edge roughness along the length of a nanoribbon can be measured using scanning tunneling microscopy (STM), as illustrated in the Example. The average rms edge roughness for the nanoribbons in a nanoribbon array will vary since longer nanoribbons within the array will tend to have rougher edges. For the purposes of this disclosure, a nanoribbon is considered to have an atomically smooth edge if its edge has an rms roughness of less than 1 nm over a length of at least 40 nm. Some embodiments of the present nanoribbon growth methods form nanoribbons having an rms roughness of less than 0.5 nm over an edge length of at least 40 nm. This includes embodiments of the growth methods that form nanoribbons that have perfectly atomically smooth edges, that is—having an rms roughness of 0 nm, over an edge length of at least 10 nm. An STM image of one such nanoribbon is shown in FIG. 11.

Short nanoribbons having atomically smooth edges, including those with perfectly atomically smooth edges, are well-suited for use as channel materials in FETs having channel lengths of 40 nm or less, including those having channel lengths as low as 10 nm. Therefore, short nanoribbons having atomically smooth edges can be identified within the nanoribbon arrays and selectively incorporated into an FET. Alternatively, short nanoribbon segments having atomically smooth edges can be cut from longer nanoribbons and selectively incorporated into an FET.

Some aspects of the invention can be attributed, at least in part, to the inventors' discovery that the germanium facet and conditions for depositing graphene via CVD from a hydrocarbon precursor can be selected to provide graphene nanoribbon growth. As a result, the present methods are distinguishable from methods in which CVD is used to grow graphene sheets on germanium via island growth. In order to distinguish the present graphene nanoribbons from other graphene structures that have been grown via CVD, graphene nanoribbons are defined, for the purposes of this disclosure, as graphene structures having aspect ratio of at least 5 and having at least two edges that run substantially parallel with each other. In addition, the present graphene nanoribbons, as grown on the germanium substrate, are characterized by the armchair crystallographic direction of graphene running substantially parallel to the long nanoribbon axis, which is oriented along the [110] directions of the germanium surface. The phrase 'substantially parallel' is used in recognition of the fact that the edges may be parallel on a global scale, but might include edge portions that deviate slightly from perfectly parallel on an atomic scale due to edge roughness.

The graphene nanoribbons are grown on the (001) facet of a germanium substrate using hydrocarbon precursor molecules, such as methane. As illustrated in the Example below, the graphene nanoribbons can be deposited from a mixture of methane gas and hydrogen gas. By varying the composition of the precursor gas mixture during growth, the duration of the growth time, and the growth temperature, the graphene nanoribbon width, length, and aspect ratio can be controlled. This control over the nanoribbon structure makes it possible to tune the graphene properties. For example, graphene undergoes a metallic-to-semiconducting transition as the nanoribbon width decreases, wherein the induced bandgap is inversely proportional to the nanoribbon width. Therefore, the present approach makes it possible to control the width of the nanoribbons and, therefore, to tailor their electronic structure. By tuning the precursor composition and growth time, nanoribbons with widths below the current lithography resolution can be achieved. For example, nanoribbons with widths below 10 nm and lengths greater than 200 nm can be grown.

Key parameters for realizing anisotropic growth are the mole fractions of the precursor molecules and the carrier molecules used in the CVD gas mixture, where the mole fractions can be adjusted by adjusting the partial pressures of the precursor and carrier gases. However, these parameters are not independent, so the optimal value for one of the parameters will depend on the others. By way of illustration only, anisotropic growth of nanoribbons from a mixture of $H_2$ and $CH_4$ can be achieved at certain combinations of temperatures in the range from about 860 to 935° C., $H_2$ mole fractions in the range from about $5.0 \times 10^{-3}$ to 0.33 and $CH_4$ mole fractions in the range from about $3.0 \times 10^{-5}$ to $2.0 \times 10^{-2}$. Guidance for selecting an appropriate combination of temperatures and mole fractions (partial pressures) is provided in the Example, below. In general, nanoribbon growth is favored by a high $H_2$ mole fraction and low $CH_4$ mole fraction, which corresponds to a slow growth rate. For example, in some embodiments of the growth methods, the growth conditions are selected to provide growth rates of no greater than 500 nm/hr. This includes embodiments in which the growth conditions are selected to provide growth rates of no greater than 300 nm/hr, further includes embodiments in which the growth conditions are selected to provide growth rates of no greater than 100 nm/hr and still further includes embodiments in which the growth conditions are selected to provide growth rates of no greater than 35 nm/hr. These growth rates refer to the growth rate of the fastest growing edge dimension of the graphene crystal structures.

The growth time also plays a role in determining the dimensions of the CVD-grown graphene nanoribbons. Generally, as growth time is decreased, narrower, shorter nanoribbons are formed. Therefore, by tuning the duration of the growth time and the ratio of precursor gas to carrier gas in the gas mixture, nanoribbons with desired lengths and widths can be selectively grown using bottom-up CVD growth.

The optimal conditions for achieving anisotropic graphene growth may vary somewhat depending upon the laboratory conditions. For example, in a cleaner environment, the growth rate at a given set of conditions would be expected to be slower than in a dirtier environment. Therefore, to achieve the same low growth rate observed under standard laboratory conditions in a cleaner system, such as a clean room, a higher $CH_4$ mole fraction and/or a lower $H_2$ mole fraction could be used.

By way of illustration, in some embodiments of the graphene nanoribbon arrays, the average aspect ratio of the nanoribbons in the array is at least 10. This includes graphene nanoribbon arrays in which the average aspect ratio of the nanoribbons in the array is at least 20, further includes graphene nanoribbon arrays in which the average aspect ratio of the nanoribbons in the array is at least 25 and still further includes graphene nanoribbon arrays in which the average aspect ratio of the nanoribbons in the array is at least 30. Included in some embodiments of such arrays are graphene nanoribbons having aspect ratios of at least 30, at least 40, at least 50, at least 60 and/or at least 70.

The average width of the graphene nanoribbons in some of the graphene nanoribbon arrays is no greater than 60 nm. This includes graphene nanoribbon arrays in which the average width of the graphene nanoribbons is no greater than 40 nm and further includes graphene nanoribbon arrays in which the average width of the graphene nanoribbons is no greater than 20 nm. Included in some embodiments of such arrays are graphene nanoribbons having widths of no greater than 10 nm and/or widths of no greater than 5 nm.

The average length of the graphene nanoribbons in some of the graphene nanoribbon arrays is at least 100 nm. This includes graphene nanoribbon arrays in which the average length of the graphene nanoribbons is at least 200 nm and further includes graphene nanoribbon arrays in which the average length of the graphene nanoribbons is at least 500 nm.

Optionally, nucleation sites can be introduced into or onto the germanium growth surface in order to control the locations at which graphene nanoribbon growth originates and the time at which graphene nanoribbon growth begins. These nucleation sites can take the form of, for example, roughed areas on the surface, grooves in the surface or metal and/or metal oxide seed particles on or embedded in the surface to catalyze nanoribbon growth.

Figure 1:
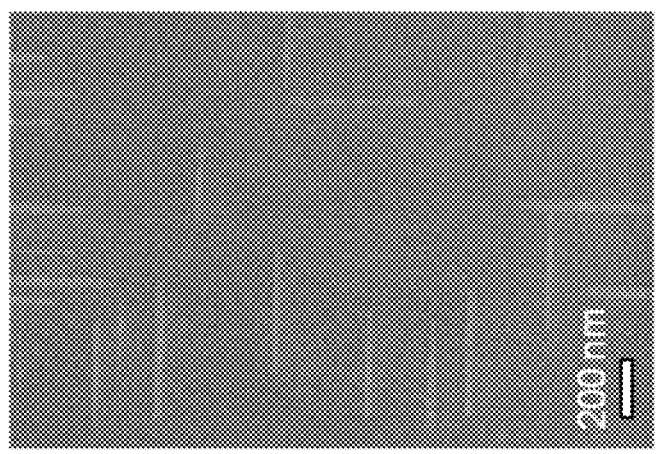
FIG. 1 is a scanning electron microscopy image of an array of graphene nanoribbons on a Ge (001) surface. The orientation of the long nanoribbon axis is controlled along two perpendicular [110] directions of germanium.

While the CVD-based graphene nanoribbon growth methods can be used to grow graphene nanoribbons having their graphene crystal lattice oriented along the two equivalent [110] directions of the Ge(001) surface, as shown in FIG. 1, they can also be used to grow graphene nanoribbons with their graphene lattice selectively oriented along only one [110] direction of the germanium. Selective growth along a single [110] direction can be achieved by miscutting the growth surface of the germanium toward the 110 direction, such that a series of parallel (001) faceted terraces, separated by steps that are a multiple of two atomic layers in height, are formed and the graphene nanoribbons are grown with a parallel alignment along the terraces. For example, the steps can be two, four, six, eight, ten, etc., atomic layers in height. The terraces can be formed using a miscut angle of, for example, about 9° or higher in order to provide steps that are two atomic layers high.

The present methods can produce graphene nanoribbon arrays having a high density of very narrow, smooth-edged, nanoribbons over a large area. Arrays of these atomically-smooth nanoribbons can include thousands of nanoribbons and can be formed over areas of, for example, at least 1 $\mu m^2$. This includes high density nanoribbon arrays that extend over areas of at least 100 $\mu m^2$, at least 1 $mm^2$, and at least 10 $mm^2$, the area of the nanoribbon arrays being limited only by the area of the surface of the substrate.

The graphene nanoribbon arrays can be incorporated into a variety of devices, including electronic and photonic devices, such as field effect transistors and photodetectors. One embodiment of a field effect transistor comprising a graphene nanoribbon array comprises: a source electrode; a drain electrode; a gate electrode; a conducting channel in electrical contact with the source electrode and the drain electrode; a gate dielectric disposed over the conducting channel, but below the gate electrode; and a germanium substrate having a (001) facet. In the transistor, the conducting channel comprises a plurality of graphene nanoribbons on the (001) facet of the germanium substrate, wherein the long nanoribbon axis is oriented along the [110] directions of the germanium surface and the nanoribbons have the armchair crystallographic direction of graphene running parallel to the long edges of the nanoribbons.

Alternatively, once the graphene nanoribbon arrays are formed on the germanium substrates, they can be transferred to other substrates, such as silicon substrates, polymer (e.g., plastic) substrates, dielectric substrates or metal substrates. Methods for transferring graphene from a germanium substrate to another substrate are described in Wang et al., *Scientific Reports* 3, Article number: 2465. The transfer procedure described in the example that follows illustrates a modified version of the methods described in Wang et al. The transferred graphene nanoribbons and the substrate onto which they are transferred can then be incorporated into a variety of devices.

Example

This example illustrates methods of growing graphene nanoribbons on the (001) facet of a germanium substrate. By varying the CVD synthesis conditions, the widths, lengths, and aspect ratios of the grown nanoribbons were controlled.

Methods:

Before growth, the Ge(001) substrates (Wafer World, resistivity >40 Ω-cm, miscut <1°) were cleaned via sonication in acetone and isopropyl alcohol for 15 minutes followed by etching in water (18 MΩ) at 90° C. for 15 minutes. The Ge(001) substrate were loaded into a horizontal tube furnace with a quartz tube diameter of 1.25 inches and the system was evacuated to ~$10^{-6}$ Torr to remove contamination. The system was then filled to atmospheric pressure with a mixture of Ar (99.999%) and $H_2$ (99.999%). The Ge(001) samples were annealed prior to introducing $CH_4$ (99.99%) at the desired growth temperature. All growth occurred at atmospheric pressure. In order to terminate growth, samples were rapidly cooled in the same atmosphere used during synthesis by sliding the furnace away from the growth region.

In order to transfer the graphene from the Ge(001) to an arbitrary substrate, PMMA was first spin-coated onto the graphene/Ge(001). Then, the PMMA/graphene/Ge(001) stack was floated on a solution of water, hydrofluoric acid, and hydrogen peroxide to etch the Ge(001). The PMMA/graphene stack was then transferred to water to clean the graphene. Next, the PMMA/graphene stack was scooped onto the target substrate. The PMMA was dissolved using acetone and further removed by annealing in vacuum at 300° C., leaving the graphene ribbons on an arbitrary substrate.

After growth, the graphene/Ge(001) samples were imaged with scanning electron microscopy (Zeiss LEO 1530) to characterize the graphene morphology. For each nanoribbon synthesis, the width and length of approximately 250 ribbons was measured from SEM images using ImageJ.

Discussion:

First, graphene was synthesized via CVD on Ge(001) at atmospheric pressure using a variety of growth temperatures (860 to 930° C.), $H_2$ mole fractions ($5.0 \times 10^{-3}$ to 0.33), and $CH_4$ mole fractions ($3.0 \times 10^{-5}$ to $2.0 \times 10^{-2}$). Growth was terminated before full graphene coverage was obtained and the graphene crystals were characterized. The growth was highly anisotropic, resulting in narrow graphene nanoribbons with high aspect ratios. The ribbons preferentially oriented along the [110] directions of the Ge(001) template, resulting in two ribbon orientations that were perpendicularly aligned. These two orientations exist with equal probability. FIG. 1 is a scanning electron microscopy image of the graphene nanoribbons on the Ge (001) surface. The orientation of the nanoribbons is controlled along two perpendicular [110] directions. The graphene nanoribbons shown in FIG. 1 were grown using a growth temperature of 910° C., a growth time of two hours and $H_2$ and $CH_4$ mole fractions of 0.33 and 0.0092, respectively.

Graphene nanoribbons nucleated over a wide range of experimental conditions, which are summarized in Table 1, which is provided in FIG. 2. However, the nanoribbon dimensions and the percentage of graphene that nucleated as nanoribbons can vary greatly depending on the growth parameters. It was found that in order to obtain high aspect ratio nanoribbons, it was important to operate in a regime in which the growth rate is especially slow, for example, on the order of 5 nm/h for growth in the direction of the nanoribbon width. The one-dimensional nature of growth was insensitive to the bulk Ge doping concentration ($0<N_{Sb}<1.5 \times 10^{18}$ cm$^{-3}$), the Ge surface termination (OH, H, and Cl) prior to synthesis, and the annealing time before growth. Graphene nanoribbons were not observed on Ge(101) or Ge(111) under any growth condition, indicating that nanoribbon nucleation is unique to the Ge(001) surface.

Figure 4:
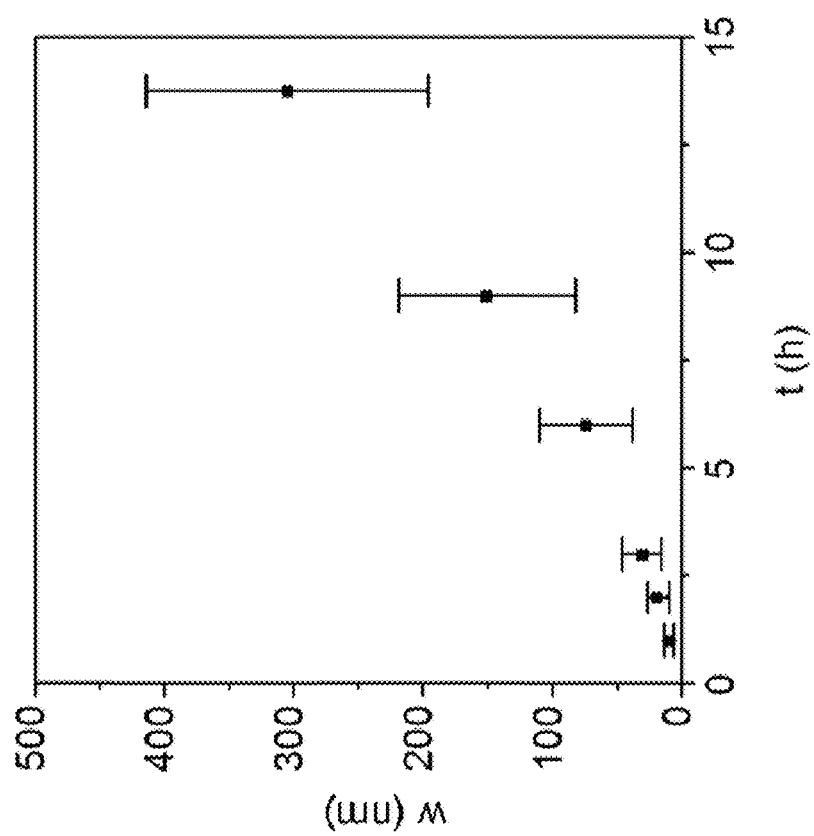
FIG. 4 is a plot of graphene nanoribbon width vs. growth time with constant $CH_4$ mole fraction (0.0092), $H_2$ mole fraction (0.33), total pressure (760 Torr), and growth temperature (910° C.). Error bars indicate standard deviation.
Figure 5:
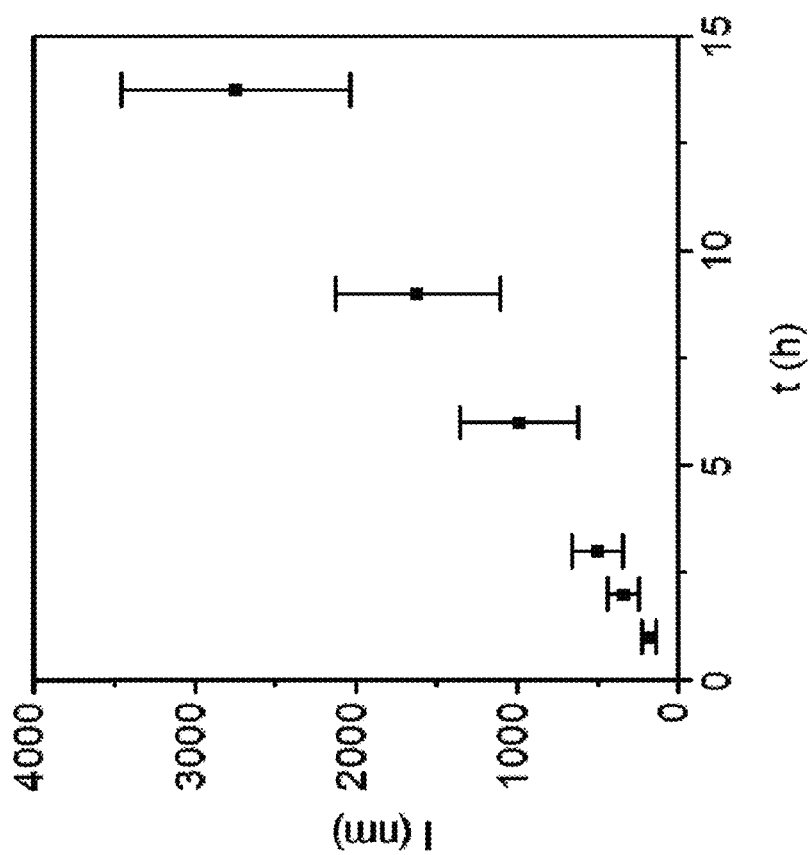
FIG. 5 is a plot of graphene nanoribbon length vs. growth time with constant $CH_4$ mole fraction (0.0092), $H_2$ mole fraction (0.33), total pressure (760 Torr), and growth temperature (910° C.). Error bars indicate standard deviation.

FIGS. 4 and 5 are graphs of the growth evolution of the graphene nanoribbons over time between 1 and 13.75 hours, with a constant growth temperature (910° C.), Ar flux (200 sccm), $H_2$ flux (100 sccm), and $CH_4$ flux (2.8 sccm). The nanoribbon width (FIG. 4) and length (FIG. 5) both decrease as the growth time was reduced. For example, after growth for 13.75 h, the average nanoribbon width and length were 305±109 nm and 2747±710 nm, respectively, and after growth for 1 h, the average nanoribbon width and length decreased to 9.8±4.0 nm and 182±42 nm, respectively. Importantly, by using short growth time, a high yield of ribbons with sub-10 nm width, which is below the resolution of optical or electron-beam lithography, can be achieved. The average nanoribbon width can be narrowed by decreasing the growth time even further; however, characterization of the size distribution of these nanoribbons was not performed because the nanoribbon widths were below the lateral resolution of scanning electron microscopy and atomic force microscopy.

Next, the effect of CVD conditions on the growth kinetics and evolution of graphene nanoribbons on Ge(001) was studied. First, the effect of the precursor composition on the graphene growth rate was explored. To determine the effect of the $CH_4$ mole fraction ($x_{CH4}$), the $CH_4$ flux was varied between 2.0 and 5.0 sccm at a constant growth temperature (910° C.), Ar flux (200 sccm), and $H_2$ flux (100 sccm). Consequently, the Ar and $H_2$ mole fractions remained nearly constant at 0.66 and 0.33, respectively, while $x_{CH4}$ was varied between 0.0066 and 0.016. Similarly, to study the effect of the $H_2$ mole fraction ($x_{H2}$), the $H_2$ flux was varied between 65 and 100 sccm at a constant growth temperature (910° C.), and $CH_4$ flux (2.0 sccm). The Ar flux was adjusted so that the total Ar and $H_2$ flux was 300 sccm. Consequently, $x_{CH4}$ remained constant at 0.0066, while $x_{H2}$ was varied between 0.22 and 0.33. The results of the growth rate studies are summarized in Table 1. Table 2 in FIG. 3 shows other growth conditions that resulted in nanoribbon formation. By dividing the length and width of the ribbon by the growth time and by a factor of two (to account for growth in both directions), the growth rate of the ribbon length, $R_l$, and width, $R_w$, respectively, were calculated. Consistent with the definition of nanoribbon presented above, the data in Tables 1 and 2 take into account only graphene structures having aspect ratios of at least 5, having at least two edges that run substantially parallel with each other along the [110] direction of the germanium growth substrate. In each experiment, graphene nanoribbons made up the majority of the graphene crystal structures. The non-nanoribbon graphene crystal structures were island structures, typically having an aspect ratio of about 1 to about 2 and were not characterized by parallel edges running along the [110] direction of the germanium.

Figure 6:
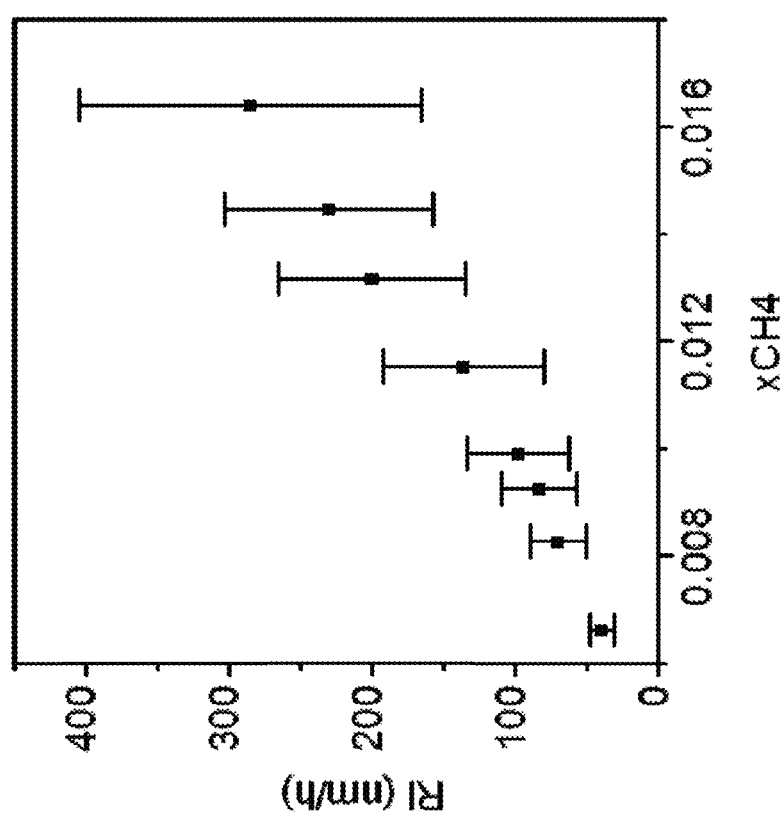
FIG. 6. Growth rate of nanoribbon length ($R_l$) plotted against methane mole fraction ($xCH_4$). The growth temperature is 910° C., Ar flux is 200 sccm, $H_2$ flux is 100 sccm, and total pressure is 760 Torr. Error bars indicate standard deviation.
Figure 7:
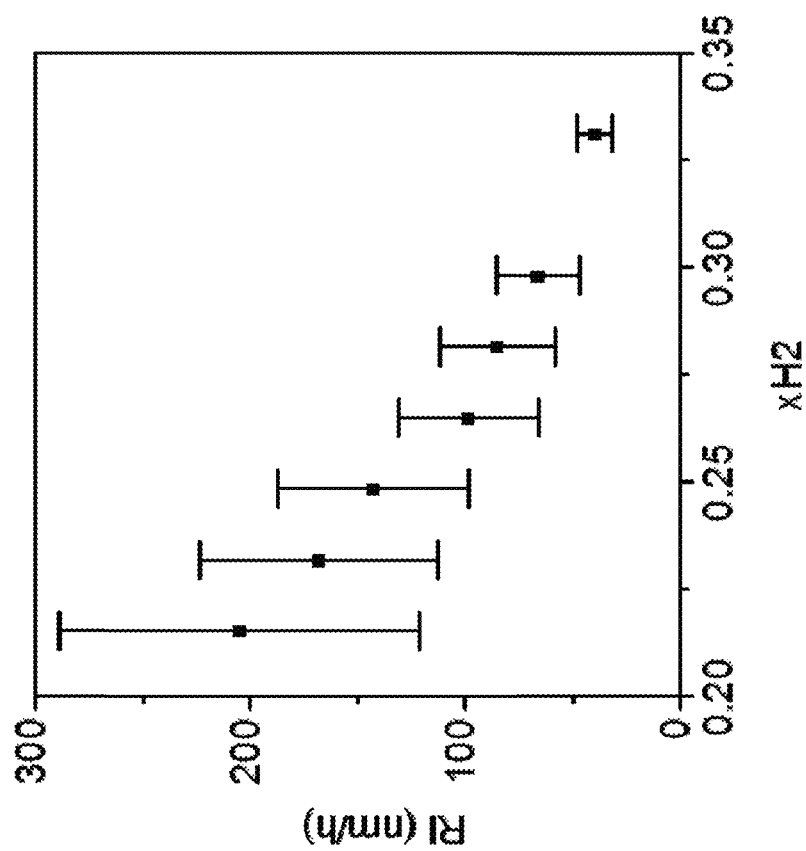
FIG. 7. Growth rate of nanoribbon length ($R_l$) plotted against hydrogen mole fraction ($xH_2$). The growth temperature is 910° C., $CH_4$ flux is 2.0 sccm, and total pressure is 760 Torr. The Ar flux is adjusted so that the total Ar and $H_2$ flux is 300 sccm. Error bars indicate standard deviation.

FIGS. 6 and 7 show the dependence of $R_l$ on $x_{CH4}$ and $x_{H2}$. $R_l$ was used to compare the growth rate under different CVD conditions because it stayed relatively constant with time. Increasing (decreasing) $x_{CH4}$ ($x_{H2}$) increased the growth rate. The $R_l$ could be controlled over an order of magnitude by changing $x_{CH4}$ and $x_{H2}$. For example, using low $x_{CH4}$ of 0.0066 and high $x_{H2}$ of 0.33, $R_l$ of 39.8±8.1 nm/h was measured and an $R_w$ of 1.42±0.57 nm/h was achieved. In contrast, increasing $x_{CH4}$ to 0.016 or decreasing $x_{H2}$ to 0.22 resulted in an $R_l$ of 285±120 and 205±84 nm/h, respectively. These slow growth rates makes it possible to finely tune the nanoribbon width and length, and therefore, the graphene properties, with high precision.

Figure 8:
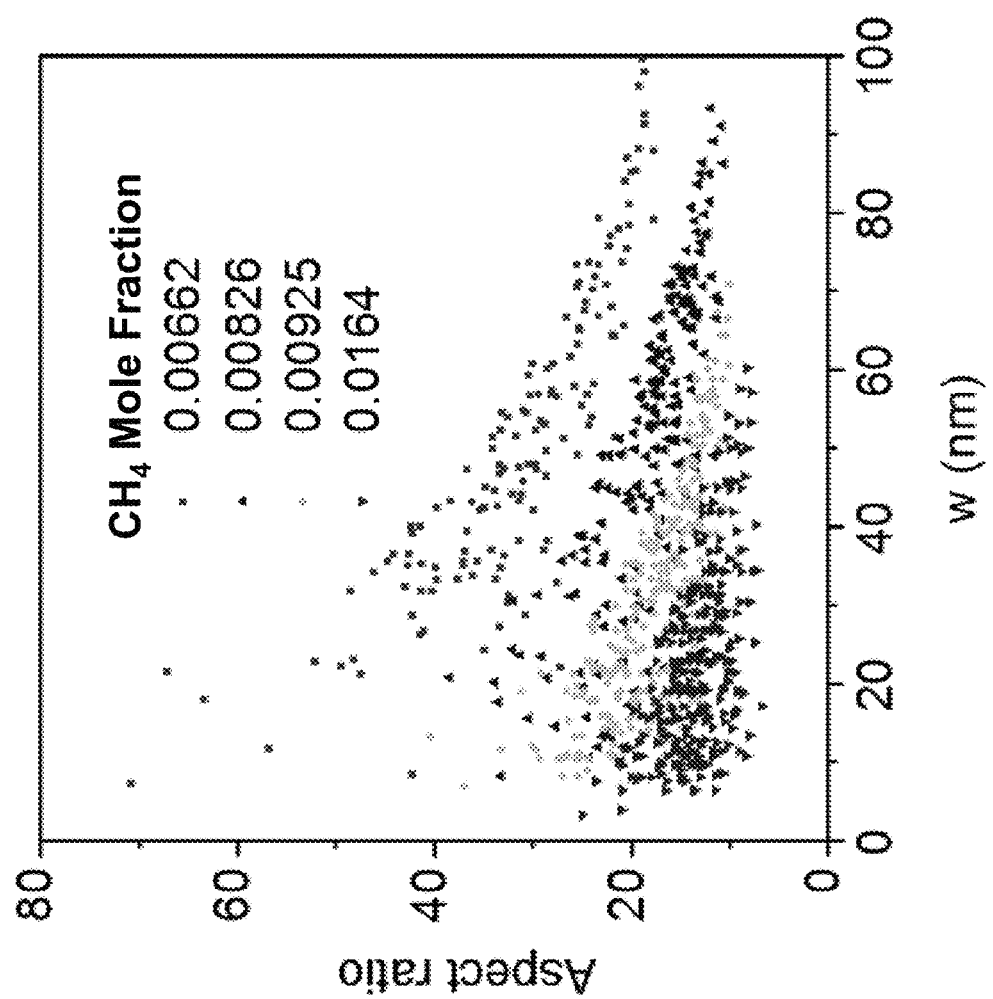
FIG. 8. Nanoribbon aspect ratio plotted against width for different $xCH_4$ in the range from about 0.00662 to about 0.0164. Growth conditions: $H_2$ mole fraction is 0.33, total pressure is 760 Torr, temperature is 910° C.
Figure 9:
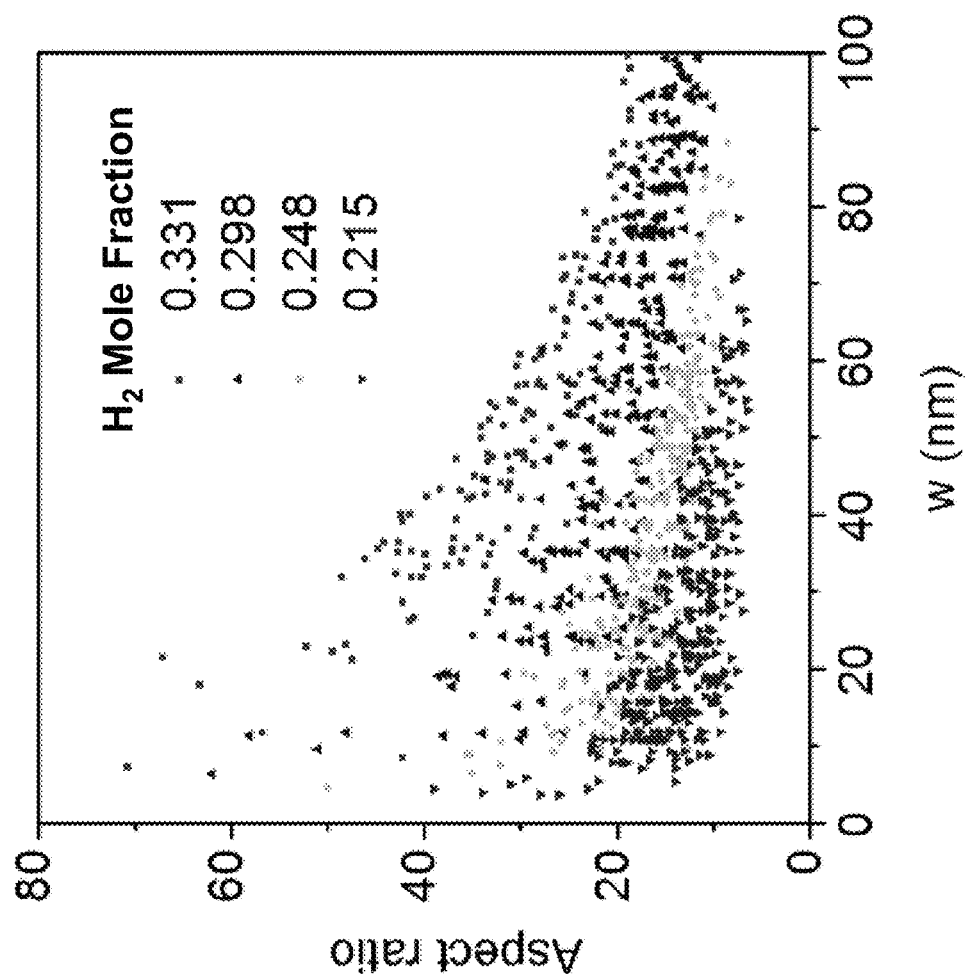
FIG. 9. Nanoribbon aspect ratio plotted against width for different $xH_2$ in the range from about 0.331 to about 0.215.

From these studies with varying precursor compositions, it was also found that the nanoribbon aspect ratios decreased with increasing $x_{CH4}$ and decreasing $x_{H2}$, corresponding to a fast growth rate, for a given nanoribbon width (FIGS. 8 and 9). Importantly, some nanoribbons with sub-10 nm width had aspect ratio >50, which makes the nanoribbons suitable for device applications in which the graphene nanoribbons need to be electrically contacted.

Next, the effect of the growth temperature on $R_l$ was studied by varying the temperature between 895 and 930° C., while maintaining constant Ar flux (200 sccm), $H_2$ flux (100 sccm), and $CH_4$ flux (2.8 sccm). FIG. 10 is a graph showing the dependence of $R_l$ on the growth temperature.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A graphene nanoribbon array comprising:
a germanium substrate having a (001) facet; and
a plurality of graphene nanoribbons on the (001) facet of the germanium substrate;
wherein the graphene nanoribbons have aspect ratios of at least 5 and the average aspect ratio of the graphene nanoribbons in the plurality of graphene nanoribbons is at least 20; and
further wherein the graphene nanoribbons have the armchair crystallographic direction of graphene running all the way along their long axes and an armchair configuration along their edges, and further wherein the long axes of the graphene nanoribbons are oriented along a [110] direction of the germanium.

2. The array of claim 1, wherein the plurality of graphene nanoribbons comprises graphene nanoribbons having edges with an rms roughness of 1 nm or lower over edge lengths of at least 40 nm.

3. The array of claim 1, wherein the plurality of graphene nanoribbons comprises graphene nanoribbons having edges with an rms roughness of 0.5 nm or lower over edge lengths of at least 40 nm.

4. The array of claim 1, wherein the plurality of graphene nanoribbons comprises graphene nanoribbons having edges with an rms roughness of 0 nm over edge lengths of at least 10 nm.

5. The array of claim 1, wherein the plurality of graphene nanoribbons comprises a first portion of graphene nanoribbons having their long axis oriented along a first [110] direction of the germanium and a second portion of graphene nanoribbons having their long axis oriented along a second [110] direction of the germanium.

6. The array of claim 1, wherein the (001) facet of the germanium comprises a series of (001) faceted terraces separated by steps that are a multiple of two atomic layers in height along a single [110] direction, and the graphene nanoribbons are oriented along the terraces with the armchair crystallographic direction of the graphene and the long nanoribbon axes oriented along a single [110] direction of the germanium.

7. The array of claim 6, wherein the plurality of graphene nanoribbons include graphene nanoribbons having widths of 5 nm or less.

8. The array of claim 1, wherein the plurality of graphene nanoribbons include graphene nanoribbons having widths of no greater than about 10 nm and average lengths of at least 200 nm.

* * * * *